United States Patent [19]

Wakeling et al.

[11] Patent Number: 4,494,110

[45] Date of Patent: Jan. 15, 1985

[54] KEYBOARD MODULES FOR USE IN DATA TERMINALS

[75] Inventors: Antony J. Wakeling; Alan D. Thompson, both of Fleet, England

[73] Assignee: Schlumberger Electronic (U.K.) Ltd., Farnborough, England

[21] Appl. No.: 354,410

[22] Filed: Mar. 3, 1982

[30] Foreign Application Priority Data

Mar. 6, 1981 [GB] United Kingdom ................ 8107181

[51] Int. Cl.³ ............................................. G06F 3/02
[52] U.S. Cl. ............................ 340/365 R; 340/365 S; 340/711
[58] Field of Search ........... 340/365 C, 365 R, 365 S, 340/711, 365 VL, 365 A; 178/17 C

[56] References Cited

U.S. PATENT DOCUMENTS

| | | | |
|---|---|---|---|
| 3,244,369 | 4/1966 | Nassimbene | 340/365 C |
| 3,750,113 | 7/1973 | Cencel | 340/365 S |
| 3,921,166 | 11/1975 | Volpe | 340/365 S |
| 4,028,695 | 6/1977 | Saich | 340/365 R |
| 4,078,257 | 3/1978 | Bagley | 340/365 VL |

OTHER PUBLICATIONS

*IBM Technical Disclosure Bulletin,* Mitchell et al., vol. 24, No. 5, Oct. 1981, pp. 2422–2423.

*Primary Examiner*—James J. Groody
*Attorney, Agent, or Firm*—Dale Gaudier

[57] ABSTRACT

A keyboard has tactile-feel keys (64–70) each with a grounded terminal (78) under an insulated touchable terminal (88) supplied with a square wave signal.

Touching a key increases the capacitive delay of the square wave signal on that key, so it is retarded relative to first delayed clock pulse which then resets a bistable circuit (142) to stop a counter (152), which controls scanning of the keys, at a value indentifying the touched key. This enables selection of the touched key to be verified, for example on an associated video display, whereafter the key can be pressed to actuate it, thereby establishing contact between its terminals. The resulting grounding of the touchable terminal suppresses the square wave signal, resetting another bistable circuit (172) in response to another, more delayed, clock pulse to generate a signal indicating that the desired key function is to be implemented.

7 Claims, 4 Drawing Figures

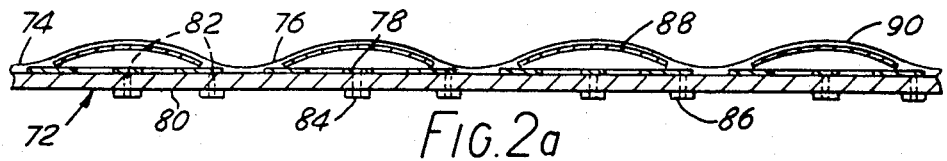
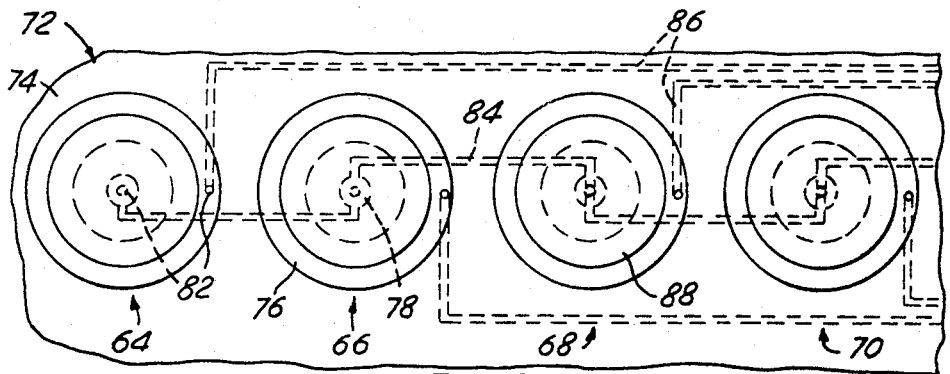
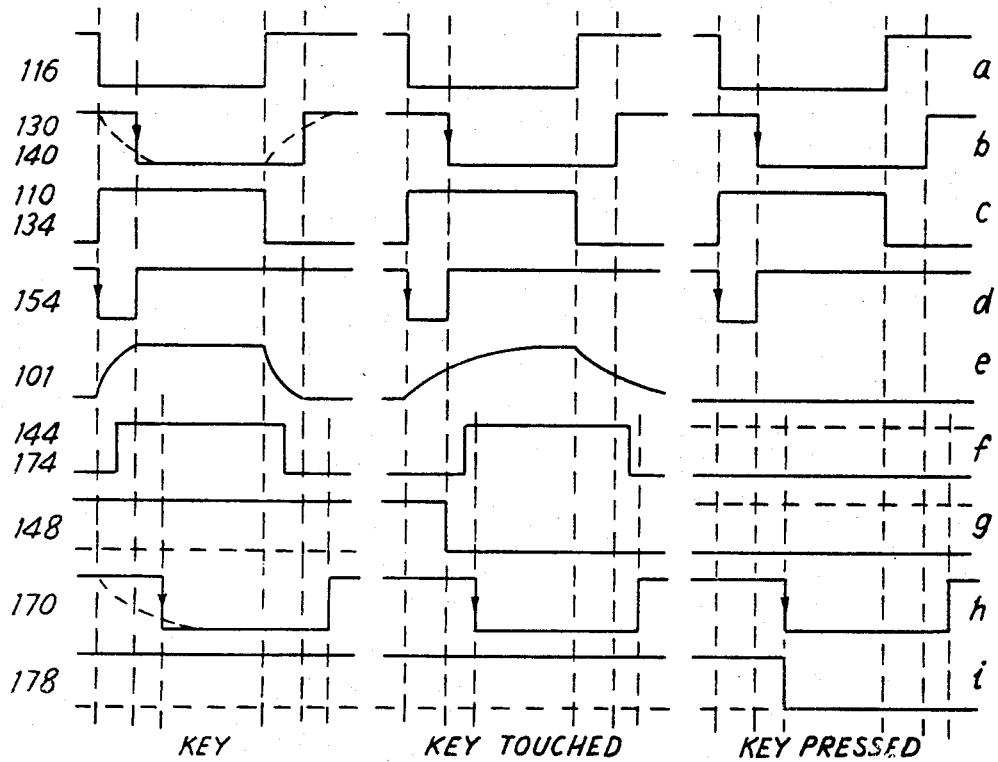

KEYBOARD MODULES FOR USE IN DATA TERMINALS

This invention relates to keyboard modules for use in manually-operable data terminals for communicating with data processors.

In our U.S. Pat. No. 4,028,695 (incorporated herein by reference) there is described a keyboard module for composing messages to be communicated to a data processor, for use in conjunction with a video display unit whereby these messages and/or messages from the processor may be displayed. As described, the keyboard has an array of variable-meaning touch keys each of which corresponds to a respective zone in a similar array of zones in the video display area, each zone displaying a message or part of a message currently represented by the associated key. When any key is touched, the corresponding zone changes (for example, by interchanging the message and background light intensities) relative to the rest of the display to indicate which key/message has been selected, so that the user can verify the selection without looking away from the display. The entire array of touch keys is arranged to move as a single unit, to operate a microswitch mounted underneath, so that when the user has verified his selection of the required one of the functions currently available (i.e. that he is touching the required key), he can proceed to implement the selected function by simply pressing down the whole array, thereby operating the microswitch and signalling the data processor that the selected function is to be effected.

Although it has been found that this arrangement facilitates simultaneous operation of the keyboard module and monitoring of the display unit by a relatively unskilled user, it also has certain disadvantages. In particular, it is expensive to manufacture and assemble, and correct adjustment of the mounting of the touch key array to ensure operation of the microswitch wherever the array is pressed is difficult to achieve. Furthermore, since there is a single switch to implement all of the key functions, there is a risk of erroneous implementation if the operator's finger slips or is not centrally placed on a key as the array is depressed.

According to one aspect of this invention there is provided a keyboard module for use in a manually-operable data terminal for communicating with a data processor, the module comprising:

a keyboard having a plurality of manually selectable keys, each of which represents a respective message or part of a message to be communicated to the processor, each having respective first and second terminals and each being selectively actuable to establish contact between its respective said terminals; and a circuit responsive to manual selection by touch without actuation of any key to produce a first output signal indicative of which key is selected, and further responsive to contact being established between the terminals of a so-selected key by actuation thereof to produce a second output signal;

whereby the first output signal may be used to verify that a desired key has been correctly selected, and the second output signal may be used to enable the respective message or part of a message represented by the selected key to be communicated to the processor.

A keyboard module in accordance with this invention will now be described, by way of example, with reference to the accompanying drawings, in which:

FIGS. 2a and 2b are respectively cross-sectional and plan fragmentary views of a keyboard forming part of the module, and FIG. 3 diagram showing waveforms at various points in the circuit.

Figure 1:
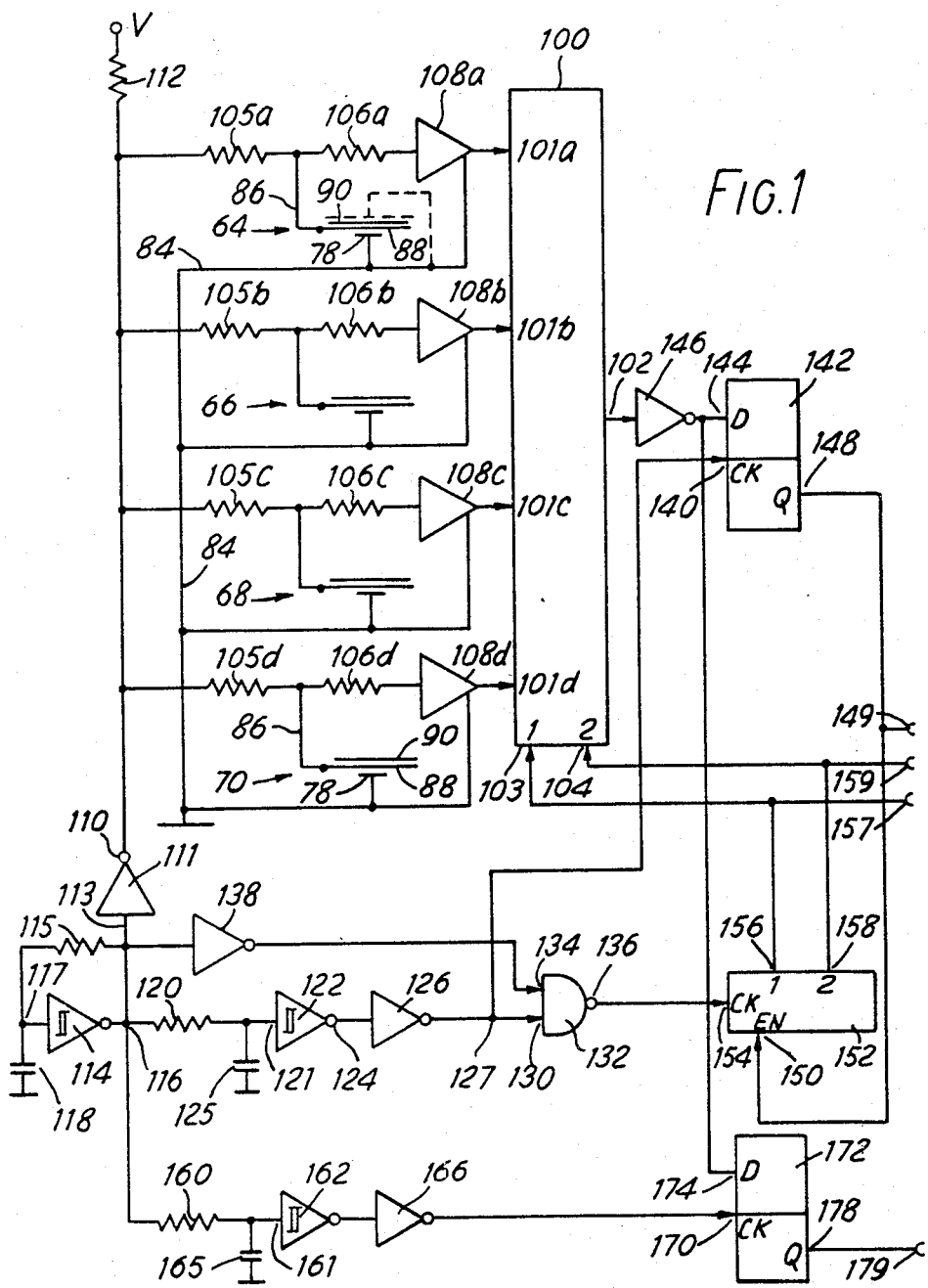
FIG. 1 is a circuit diagram of the module.

The module to be described is intended for use in a data terminal for communicating with a data processor in the general manner discussed above. Further details of the use of the module and of the related operation of the data processor are contained in our U.S. Pat. No. 4,028,695 and thus need not be repeated here.

Referring to FIG. 1, the module has a plurality of keys, typically sixty-four in an eight-by-eight array, only four of which are shown, at 64, 66, 68 and 70, for the sake of simplicity. As noted earlier, the function of each key at any given time is indicated by a respective zone in a corresponding eight-by-eight array of zones on a video display unit forming part of the data terminal in which the module is incorporated.

The keys are of the kind known as tactile-feel keys, which although requiring relatively light finger pressure for their operation, have an abrupt over-centre mode of operation, thus providing positive tactile feedback to the operator of the occurrence of the switching operation. The form of the keys 64 to 70 is illustrated in FIGS. 2a and 2b.

Referring to FIGS. 2a and 2b, the keyboard is based on a double-sided printed circuit board 72. The upper side 74 of the board 72 is etched to provide a regular eight-by-eight array of rings 76 enclosing concentric dots 78. The lower side 80 of the board 72 is etched to form a connection pattern, coupled to the rings 76 and the dots 78 via appropriately-positioned plated-through holes 82, so that all the dots 78 are interconnected by a common track 84 and each ring 76 has a separate connection track 86. The tracks 84 and 86 terminate at edge connector pads (not shown) at the edge of the board 72. A respective domed disc 88 of thin stainless steel sheet rests centrally on each ring 76 with its periphery in contact with the ring 76 and its centre above and spaced from the associated dot 78. The discs 88 are held in position by a sheet 90 of polyester film, such as polyethylene terephthalate, stretched tightly over and bonded firmly to the upper side 74 of the board 72 (this sheet has been omitted from FIG. 2b in the interests of clarity). The arrangement is such that light but definite finger pressure on the sheet 90 over a disc 88 will cause that disc to flatten resiliently, thereby contacting the dot 78 below it and establishing an electrical connection between the dot 78 and the surrounding ring 76. Upon removal of this pressure the disc 88 recovers its normal shape, thereby breaking the connection again. The material, dimensions and shape of the discs 88 are chosen to minimise the pressure needed to actuate the keys 64 etc., while at the same time ensuring that a positive pressure, rather than mere touching, is required to deform the discs 88 and thus close the switch.

Referring again to FIG. 1, the keyboard module includes a scanner which continuously and sequentially scans the keys 64, 66, 68, and 70 and provides at an output 157/159 signals identifying any single key which is touched, plus signals at outputs 149 and 179 indicating that a key has been touched or pressed respectively.

The scanner comprises a multiplexing switch 100 having four inputs 101a, 101b, 101c, and 101d, an output 102 and two address inputs 103 and 104. A signal path may be established between any one input 101 and the output 102 by application of the appropriate one of four different coded signals at the address inputs 103 and 104. Two resistors 105a and 106a and a Schmitt buffer 108a are connected in series between the input 101a and the output 110 of a driver 111. The output 110 is also connected through a resistor 112 to a source of reference potential $V_{ref}$.

The disc 88 of the key 64 is connected via the respective ring 76 and track 86 to the junction point of the resistors 105a and 106a, while the associated dot 78 is grounded to the circuit common potential via the common track 84. Inputs 101b, 101c, and 101d are similarly connected via series resistor pairs and buffers 105b, 106b and 108b. 105c, 106c and 108c, 105d, 106d and 108d to the output of the driver 111, with associated keys 66, 68, 70.

The driver 111 receives pulses at its input 113 from a pulse generator comprising a trigger circuit 114 having a resistor 115 connected between its output 116 and its input 117, and a capacitor 118 between its input 117 and ground.

The output 116 of the pulse generator is connected via a resistor 120 to the input 121 of a trigger 122 which has an output 124. A capacitor 125 is connected between the input 121 and ground. The output 124 is connected via an inverter 126 to one input 130 of a two input NAND gate 132 which has a second input 134 and an output 136. The second input 134 receives pulses via an inverter 138 from the output 116 of the pulse generator.

The output 127 of the inverter 126 is also connected to the clock input 140 of a clocked D-type bistable circuit 142. This bistable circuit has in addition to the clock input 140, a signal input 144 and a signal output 148; in operation, the logic level at the signal input 144 at the instant when the logic signal at the clock input changes from a logic level 1 to logic level 0 is transmitted to the signal output 148. The output 102 of the multiplexer 100 is connected via an inverter 146 to the signal input 144, while the signal output 148 is connected to the 'enable' input 150 of a 4 bit counter 152. The counter 152 has a clock input 154 connected to receive pulses from the output 136 of the NAND gate 132, and provides an output signal representative of the accumulated count therein at outputs 156 and 158, which are connected respectively to the address inputs 103 and 104 of the multiplexer 100.

The scanner output 157/159 mentioned above is coupled to the counter outputs 156 and 158, and the scanner output 149 is coupled to the bistable circuit 142.

The output 102 of the multiplexer 100 is also connected via the inverter 146 to the signal input 174 of a second D-type bistable circuit 172, the clock input 170 of which receives clock pulses from the output 116 of the pulse generator via a resistor 160, a trigger 162 and an inverter 166. These three components are arranged similarly to the corresponding parts 120, 122 and 126 already described, with a capacitor 165 connected between the input 161 of the trigger 162 and ground, the value of this capacitor being somewhat greater than that of the capacitor 125. The output 178 of the bistable circuit 172 is connected to the scanner output 179.

The broad principle of operation of the keyboard and scanner circuit of FIG. 1 is that the pulses produced at the output 116 of the pulse generator are counted by the counter 152, the output of which cyclically advances the multiplexing switch 100 from one input 101 to the next until one of the keys 64, 66, 68, 70 is touched; when next the multiplexing switch 100 connects the input 101 corresponding to the touched key to its output 102, the enabling signal from the bistable circuit 142 to the counter 152 will be removed, and the multiplexing switch will stop at the touched key. The output address of the counter 152 (i.e. the count therein) then designates the key touched. If the key is then actually pressed to establish contact between its terminals, an additional signal indicative of this is supplied by the bistable circuit 172.

The detailed operation of the circuits of FIG. 1 is illustrated by reference to FIG. 3, which shows wave forms at various points of the circuit of FIG. 1 for the cases where no key is touched, where a key is touched, and where a key is pressed.

FIG. 3a shows a pulse at the output 116 of the pulse generator 114. The pulse is delayed by the combination of the resistor 120 and capacitor 125, which together constitutes a low pass filter, and the delayed pulse, which appears at the inputs 130 and 140, is shown in FIG. 3b.

FIG. 3c shows the pulse of FIG. 3a, after inversion by the inverters 111 and 138 respectively as it appears at points 110 and 134, while FIG. 3d shows the pulse at the clock input 154 of the counter 152 marking the coincidence of logic state 1 at the inputs 130 and 134 of the NAND gate 132.

FIGS. 3e and 3f show the respective waveforms at the inputs 101 of the scanner 100, and the inputs 144 and 174 of the bistable circuits 142 and 172. It can be seen from the first column that when a key is not loaded by the additional capacity of a human finger, the leading edge of the pulse from the driver 111 is only slightly delayed by the limited capacitance between the disc 88 and the dot 78 of a key. Consequently, the leading edge of the input pulse to the bistable circuits 142 and 172 occurs before the active edge of the clock pulse to the circuit 142, so a logic 1 is maintained at its output 148 (FIG. 3g).

FIG. 3h shows the clock pulse for the bistable circuit 172, which pulse is more delayed than the clock pulse for the bistable circuit 142 owing to the higher value of the capacitor 165. Thus, when no key is touched, the leading edge of the input pulse to the bistable circuits 142 and 172 occurs also before the active edge of the clock pulse to the circuit 172, so a logic 1 is also maintained at its output 178 (FIG. 3i).

When a key is touched, an additional capacitor is effectively connected between the junction point of the corresponding resistors 105, 106 and ground. The electrodes of this effective capacitor, indicated in dashed line in the case of the key 64 in FIG. 1, are the disc 88 and the finger of the operator touching the key, and the insulating dielectric comprises the polyester film 90 covering the disc 88. This additional capacitor increases the delay affecting the pulse at the input 101 for the touched key, as shown in the second column of FIG. 3, at line e. Thus, the leading edge of the input pulse to the bistable circuits 142 and 172 (FIG. 3f) now occurs after the active edge of the clock pulse for the circuit 142 (FIG. 3b) but still before the active edge of the clock pulse for the circuit 172 (FIG. 3h). As a result the output 148 of the circuit 142 changes to a logic 0 (FIG. 3g), while the output 178 of the circuit 172 remains at logic 1 (FIG. 3i).

If now the touched key is pressed to actuate it and establish contact between its terminals, the associated input 101 of the multiplexing switch 100 is shorted directly to ground—see the third column of FIG. 3, especially FIG. 3e. Thus, the inputs 144, 174 of the bistable circuits 142 and 172 are both at logic 0 (FIG. 3f) when the active edge of their respecitve clock pulses (FIGS. 3b, 3h) occurs, so the outputs 148, 178 of both circuits supply a logic 0 signal (FIGS. 3g, 3i).

Therefore, the output 148 remains at logic level 1, enabling the counter 152, only so long as no key is touched. Touching a key resets the bistable circuit 142, indicating that a key has been touched, stops the counter 152 to freeze the count therein and identify the touched key, and can additionally serve as an interrupt signal on the output 149 to the data processor to read in the address on the output 157/159 corresponding to the touched key. Pressing a key resets the bistable circuit 172, indicating to the data processor on the output 179 that the function previously identified by touching the key is to be implemented and the subsequent step in the procedure is to be executed.

The arrangement described and illustrated herein has the advantage of being cheaper and of simplifying the moving parts of the apparatus, in particular by avoiding the need for a complex and finely adjusted moving suspension for the entire keyboard. In addition, the risk of erroneous keying is reduced, since the second step, of key actuation, can only occur if the operator's finger is properly positioned more or less centrally over the disc 88 of the key.

We claim:

1. A keyboard module for use in a manually operable data terminal for communicating with a data processor, the module comprising:
   a keyboard having a plurality of manually selectable keys, each of which represents a respective message or part of a message to be communicated to the processor, each key including first and second terminals, with each key being selectively actuable by movement of its second terminal to contact its respective first terminal, and wherein said first terminals are interconnected and directly grounded; and
   a circuit connected to said first and second terminals and responsive to manual selection by touch without actuation of any key to produce a first output signal indicative of which key is selected, and further responsive to actuation of the selected key to produce a second output signal, said circuit including:
   a pulse generator for generating a first train of pulse;
   a plurality of first delay circuits each including a respective one of said keys and connected to receive and delay the first train of pulses; and second and third delay circuits connected to receive and delay the first train of pulses so as to produce second and third trains of pulses each delayed by a respective and different time interval with respect to the first train, the delay time interval for the second train being intermediate respective first and second delays produced by each first delay circuit when its respective key is respectively not touched and touched and the delay time interval for the third train being greater than said second delay; said circuit being arranged to receive said first train via said first delay circuits and said second and third trains, and to produce said first or second output signal respectively when it receives a pulse of said second or third train respectively without having first received the corresponding pulse of said first train;

whereby the first output signal indicates that a desired key has been correctly selected and the second output signal enables the respective message or part of a message represented by the selected key to be communicated to the processor.

2. A keyboard module according to claim 1, wherein said second terminals are covered by an insulating layer, said layer being deformable with movement of said second terminal of the selected key during actuation.

3. A keyboard module according to claim 1,
   wherein said circuit has scanning means for sequentially addressing the keys, and means for stopping the scanning means when it addresses a touched key, whereby the address in the scanning means when it is stopped identifies the touched key.

4. A keyboard module according to claim 3, wherein the stopping means is arranged to receive the second pulse train, and the scanning means comprises a counter for counting the pulses of one of the trains and a multiplexing switch responsive to the count in the counter for sequentially connecting the stopping means to receive the first train via each one of the first delay circuits in turn, the stopping means being arranged to stop the counter when it receives a pulse of said second train without having first received the corresponding pulse of said first train.

5. A keyboard module according to claim 4, wherein the stopping means comprises a clocked bistable circuit having a signal input connected to receive the first train via the multiplexing switch and a clock input connected to receive the second train, and including another clocked bistable circuit for producing said second output signal having its signal input also connected to receive the first train via the multiplexing switch and its clock input connected to receive the third train.

6. A keyboard module according to claim 1, wherein said second terminal of each of said keys is resiliently deformable to provide a tactile feel.

7. A keyboard module according to claim 6, wherein the second terminal of each key overs the respective first terminal.

* * * * *